US012114455B2

United States Patent
Isaji et al.

(10) Patent No.: US 12,114,455 B2
(45) Date of Patent: Oct. 8, 2024

(54) CIRCUIT UNIT

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yusuke Isaji, Mie (JP); Hitoshi Takeda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 200 days.

(21) Appl. No.: 17/918,268

(22) PCT Filed: Apr. 23, 2021

(86) PCT No.: PCT/JP2021/016396
§ 371 (c)(1),
(2) Date: Oct. 11, 2022

(87) PCT Pub. No.: WO2021/215524
PCT Pub. Date: Oct. 28, 2021

(65) Prior Publication Data
US 2023/0171910 A1    Jun. 1, 2023

(30) Foreign Application Priority Data
Apr. 24, 2020 (JP) .................. 2020-077548

(51) Int. Cl.
*H05K 7/02* (2006.01)
*H02G 3/16* (2006.01)
(Continued)

(52) U.S. Cl.
CPC ................. *H05K 7/06* (2013.01); *H02G 3/16* (2013.01); *H05K 7/026* (2013.01); *H05K 7/1427* (2013.01)

(58) Field of Classification Search
CPC ......... H05K 7/1427; H05K 7/02; H05K 7/026
See application file for complete search history.

(56) References Cited

U.S. PATENT DOCUMENTS 5,764,487 A * 6/1998 Natsume ............. B60R 16/0238
361/823
8,426,752 B2 * 4/2013 Hashikura .......... H05K 7/20854
174/541
(Continued)

FOREIGN PATENT DOCUMENTS

JP    2013-192366    9/2013
JP    2017-147881    8/2017
(Continued)

OTHER PUBLICATIONS

International Search Report issued in International Bureau of WIPO Patent Application No. PCT/JP2021/016396, dated Jul. 13, 2021, along with an English translation thereof.

*Primary Examiner* — Sherman Ng
(74) *Attorney, Agent, or Firm* — Greenblum & Bernstein. P.L.C.

(57) ABSTRACT

Disclosed is a circuit unit with a novel structure that can counter the heat generation by resistors while suppressing an increase in size and cost of the circuit unit. A circuit unit includes a wiring member, a lower case that holds the wiring member, an upper case that covers the lower case, and resistors connected to the wiring member, wherein the upper case include wall portions that surround peripheries of the resistors, and wherein, in a first orthogonal direction orthogonal to the longitudinal direction of the resistors, the separation distance between intermediate portions in the (Continued)

longitudinal direction of the resistors and the wall portions of the upper case is greater than the separation distance between end portions in the longitudinal direction of the resistors and the wall portions of the upper case.

4 Claims, 5 Drawing Sheets

(51) Int. Cl.
*H05K 7/06* (2006.01)
*H05K 7/14* (2006.01)

(56) References Cited

U.S. PATENT DOCUMENTS

| | | | |
|---|---|---|---|
| 2006/0289664 A1* | 12/2006 | Tomikawa | B60R 16/0239 237/12.3 R |
| 2014/0273554 A1 | 9/2014 | Sugimoto | |
| 2016/0126706 A1* | 5/2016 | Melchor Saucedo | H05K 5/0069 361/626 |
| 2016/0242305 A1* | 8/2016 | Maebashi | B60R 16/0238 |
| 2017/0150630 A1 | 5/2017 | Lyon et al. | |
| 2018/0027646 A1* | 1/2018 | Sumida | H05K 7/20854 361/720 |
| 2018/0065576 A1* | 3/2018 | Kawaguchi | H01R 9/226 |
| 2019/0214805 A1* | 7/2019 | Hiramitsu | B60R 16/02 |
| 2019/0319377 A1* | 10/2019 | Shiomi | H01R 9/18 |
| 2019/0380214 A1* | 12/2019 | Sasaki | H05K 5/0247 |
| 2020/0022284 A1 | 1/2020 | Kita | |
| 2020/0051765 A1 | 2/2020 | Hiramitsu et al. | |

FOREIGN PATENT DOCUMENTS

| | | |
|---|---|---|
| JP | 2018-038128 | 3/2018 |
| JP | 2018-085815 | 5/2018 |
| JP | 2018-098927 | 6/2018 |
| JP | 2018-537940 | 12/2018 |

* cited by examiner

CIRCUIT UNIT

TECHNICAL FIELD

The present disclosure relates to circuit units.

BACKGROUND ART

Patent Document 1 discloses a circuit unit housed together with a battery module and a battery control system, etc., in the housing of a battery pack installed in a vehicle. In such a circuit unit, wiring members are housed between an upper case and a lower case, and electrical components such as fuses, relays, resistors, etc., held in a cavity provided in the upper case are conductively connected to the wiring members.

CITATION LIST

Patent Documents

Patent Document 1: JP2018-537940A (Translation of PCT Application)

SUMMARY OF INVENTION

Technical Problem

In the structure of Patent Document 1, as the electrical components are accommodated in the cavity provided in the upper case, only a small gap is provided between the walls of the upper case that partition the cavity and the electrical components. Therefore, when there is a resistor that instantly generates a large amount of heat (equivalent to the resistor of this application), there is a concern that the heat generated by the resistor may have an adverse effect on the wall of the upper case that surround the circumference of the resistor. To address this, it is possible to form the upper case from a resin material with a high heatproof temperature, but this will inevitably increase the manufacturing costs. It is also possible to increase the thermal capacity of the resistor without changing the resin material of the upper case if the size of the resistor is increased. However, this is hardly a desirable approach because the overall size of the circuit unit will inevitably increase as the size of the resistor increases.

Therefore, disclosed is a circuit unit with a novel structure that can better counter the heat generated by a resistor while suppressing an increase in size and cost of the circuit unit.

Solution to Problem

A circuit unit of the present disclosure comprises a wiring member, a lower case that holds the wiring member, an upper case that covers the lower case, and a resistor connected to the wiring member, wherein the upper case includes a wall portion that surrounds a circumference of the resistor, and wherein, in a first orthogonal direction orthogonal to a longitudinal direction of the resistor, a separation distance between an intermediate portion in the longitudinal direction of the resistor and the wall portion of the upper case is greater than a separation distance between end portions in the longitudinal direction of the resistor and the wall portion of the upper case.

Advantageous Effects of Invention

According to the present disclosure, it is possible to counter the heat generated by a resistor while suppressing an increase in the size and cost of a circuit unit.

BEST MODES TO CARRY OUT INVENTION

Description of Embodiments

Figure 1:
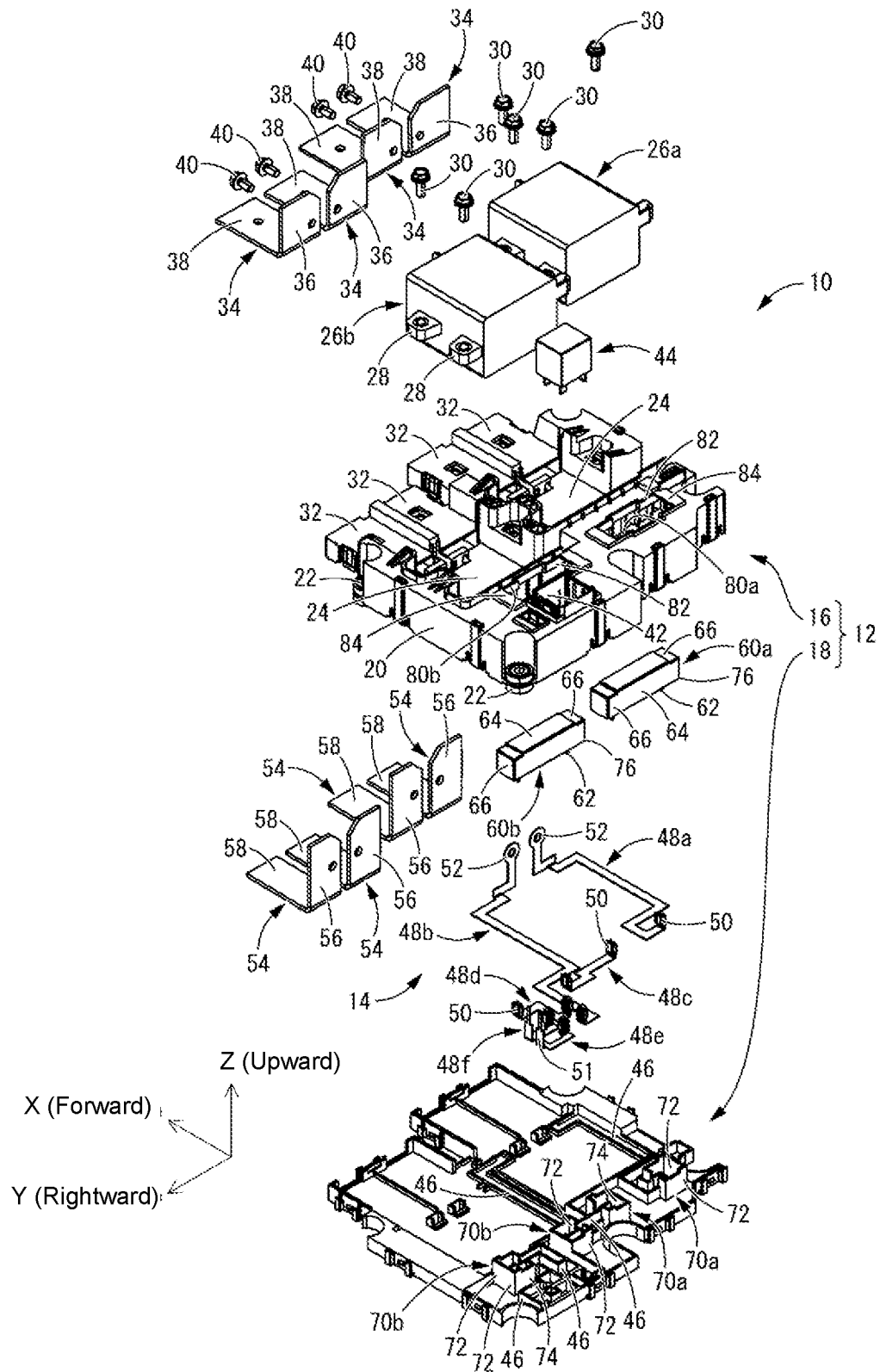
FIG. 1 is a perspective exploded view of a circuit unit according to Embodiment 1.

First, embodiments of the present disclosure will be listed and described.

A circuit unit of the present disclosure is a circuit unit comprises:

(1) a wiring member, a lower case that holds the wiring member, an upper case that covers the lower case, and a resistor connected to the wiring member, wherein the upper case includes a wall portion that surrounds a circumference of the resistor, and wherein, in a first orthogonal direction orthogonal to a longitudinal direction of the resistor, a separation distance between an intermediate portion in the longitudinal direction of the resistor and the wall portion of the upper case is greater than a separation distance between end portions in the longitudinal direction of the resistor and the wall portion of the upper case.

According to the circuit unit of the present disclosure, in the first orthogonal direction orthogonal to the longitudinal direction of the resistor, the separation distance between the intermediate portion in the longitudinal direction of the resistor and the wall portion of the upper case is greater than the separation distance between the end portions in the longitudinal direction of the resistor and the wall portion of the upper case. As such, a large separation can be secured between the intermediate portion in the longitudinal direction of the resistor, where the temperature becomes high due to heat generation by the resistor, and the wall portion of the upper case, allowing for suppressing the adverse effects of the heat generation by the resistor on the upper case. As a result, it is possible to counter the heat generation by the resistor in the circuit unit without forming the upper case from a resin material with a high heatproof temperature. In addition, as there is no need to increase the thermal capacity of the resistor by increasing the size of the resistor, it is possible to counter the heat generation by the resistor in the circuit unit without increasing the size of the circuit unit.

(2) It is preferable that, in the second orthogonal direction orthogonal to the longitudinal direction, the separation distance between the intermediate portion of the resistor and the lower case is greater than the separation distance between the end portions of the resistor and the lower case. The separation distance between the intermediate portion and the lower case in the second direction is greater than the separation distance between the end portions of the resistor and the lower case in the second direction. Therefore, the lower case may be significantly separated from the intermediate portion of the resistor, where the temperature becomes high due to the heat generation by the resistor. Therefore, the adverse effects of the heat generation by the resistor on the lower case can be suppressed, that is, the heat generation by the resistor can be further advantageously countered in the circuit unit while suppressing an increase in size and cost of the circuit unit.

Note that the second orthogonal direction is a term that refers to the direction of the separation distance between the lower case and the resistor. While this is referred to as the second one for convenience in order to differentiate it from the first orthogonal direction, which indicates the direction of the separation distance between the wall portion of the upper case and the resistor, the first orthogonal direction and the second orthogonal direction may be different directions, such as those intersecting each other, or the same direction.

(3) It is preferable that the upper case includes presser portions that are in contact with a top surface of the resistor. Even if the separation distance between the resistor and the upper case or the lower case is large in an orthogonal direction orthogonal to the longitudinal direction of the resistor, the presser portions provided on the upper case can hold the resistor between the presser portions and the lower case to prevent the resistor from being disengaged from the wiring member. As a result, it is possible to realize both heat dissipation and stable retention of the resistor in the circuit unit.

(4) It is preferable that the lower case includes positioning ribs into which the end portions of the resistor are inserted. This is preferable because the lower case can stably hold the resister with the end portions of the resistor inserted into the positioning ribs. Note that although the resistor may be positioned with respect to the lower case by inserting a pair of diagonal corners of the resistor into the positioning ribs, more preferably, all the four corners of the resistor are inserted into the positioning ribs.

(5) It is preferable that the intermediate portion of the resistor is a portion located between a pair of terminal portions in the longitudinal direction that protrudes from a bottom surface of the resistor. This is preferable because as heat is generated between the pair of terminal portions, it can be effectively dissipated by the intermediate portion.

DETAILS OF EMBODIMENTS OF THE PRESENT DISCLOSURE

Specific examples of a circuit unit of the present disclosure will be described below with reference to the drawings. Note that the present disclosure is not limited to these examples, and is indicated by the claims, and is intended to include all modifications within the meaning and range of equivalency to the claims.

Embodiment 1

Embodiment 1 of the present disclosure will be described hereinafter with reference to FIGS. 1-5. A circuit unit 10 of Embodiment 1 is a power distribution component for a battery pack used in a vehicle and, as shown in FIG. 1, includes a structure in which a wiring member 14 is housed in a case 12. The case 12 is composed of an upper case 16 and a lower case 18 assembled together in a vertical direction in FIG. 1. In the description below, "upward" refers to the Z-direction in FIG. 1, "forward" refers to the X-direction in FIG. 1, and "right" refers to the Y-direction in FIG. 1. Furthermore, in the description below, "longitudinal direction" refers to a left-right direction, "first orthogonal direction" refers to a front-rear direction, and "second orthogonal direction" refers to a vertical direction. Note that where there is a plurality of identical members, one of the identical members may be indicated by a reference symbol while such indication may be omitted for the remaining members.

Upper Case 16

The upper case 16 is made of a synthetic resin and formed in an approximate rectangular box shape that is open toward the lower case 18 (toward the bottom), with a peripheral wall 20 extending tubular from the circumference of the top surface toward the lower case 18. A plurality of attaching members 22 is attached to the peripheral edges of the upper case 16, and the upper case 16 is attached to a counterpart, such as an unshown battery pack housing, with unshown bolts that are inserted through the attaching members 22.

Figure 2:
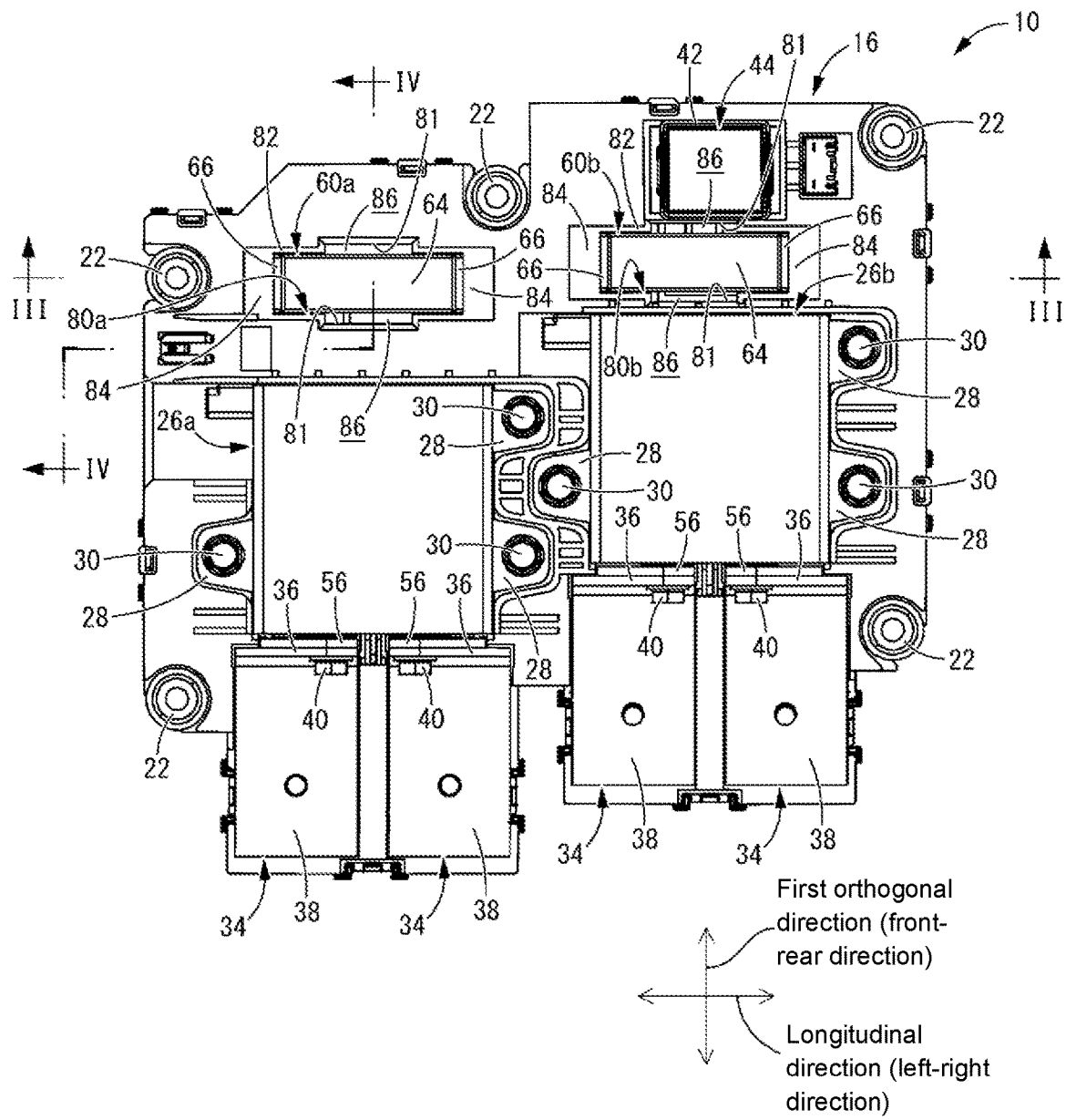
FIG. 2 is a plan view of the circuit unit shown in FIG. 1.

Two power relay mount portions 24 are formed on the top surface of the upper case 16. As shown in FIG. 2, power relays 26a, 26b are mounted on the two power relay mount portions 24 of the upper case 16. The power relays 26a, 26b may have the shape of an approximately rectangular solid, and a plurality of bolt insertion lugs 28 protrude to the left and right thereof. The power relays 26a, 26b are secured to the upper case 16 by fastening bolts 30 inserted through the bolt insertion lugs 28 of the power relays 26a, 26b in the upper case 16. As shown in FIG. 1, provided on the top surface of the upper case 16 are two plate-shaped terminal supports 32 adjacent to and frontward of the two power relay mount portions 24. Moreover, as shown in FIG. 2, upper terminal brackets 34 are mounted to the terminal supports 32. The upper terminal brackets 34 are formed of a conductive metallic material, and formed into L-shaped metallic parts each having a flat-plate fixing portion 36 and a contact portion 38. The fixing portions 36 of the two sets of upper terminal brackets 34 are set on the power relays 26a, 26b and secured to the power relays 26a, 26b with bolts 40, conductively connecting the upper terminal brackets 34 with the power relays 26a, 26b. A set of two upper terminal brackets 34 is connected to each of the power relays 26a, 26b at positions spaced apart in the left-right direction.

A pre-charge relay mount portion 42 is formed at the top surface of the upper case 16. The pre-charge relay mount portion 42 is formed in the shape of a rectangular tube, and a pre-charge relay 44, which constitutes a pre-charge circuit, is attached to the upper case 16 from above.

Lower Case 18

As the upper case 16, the lower case 18 is made of a synthetic resin and has the shape of an approximately rectangular flat plate as shown in FIG. 1. A plurality of busbar mount portions 46 is formed on the top surface of the lower case 18. The busbar mount portions 46 conform to the shape of respective busbars 48a-48f, which will be described below, and are formed as concave grooves to accommodate the busbars 48a-48f in position.

Figure 3:
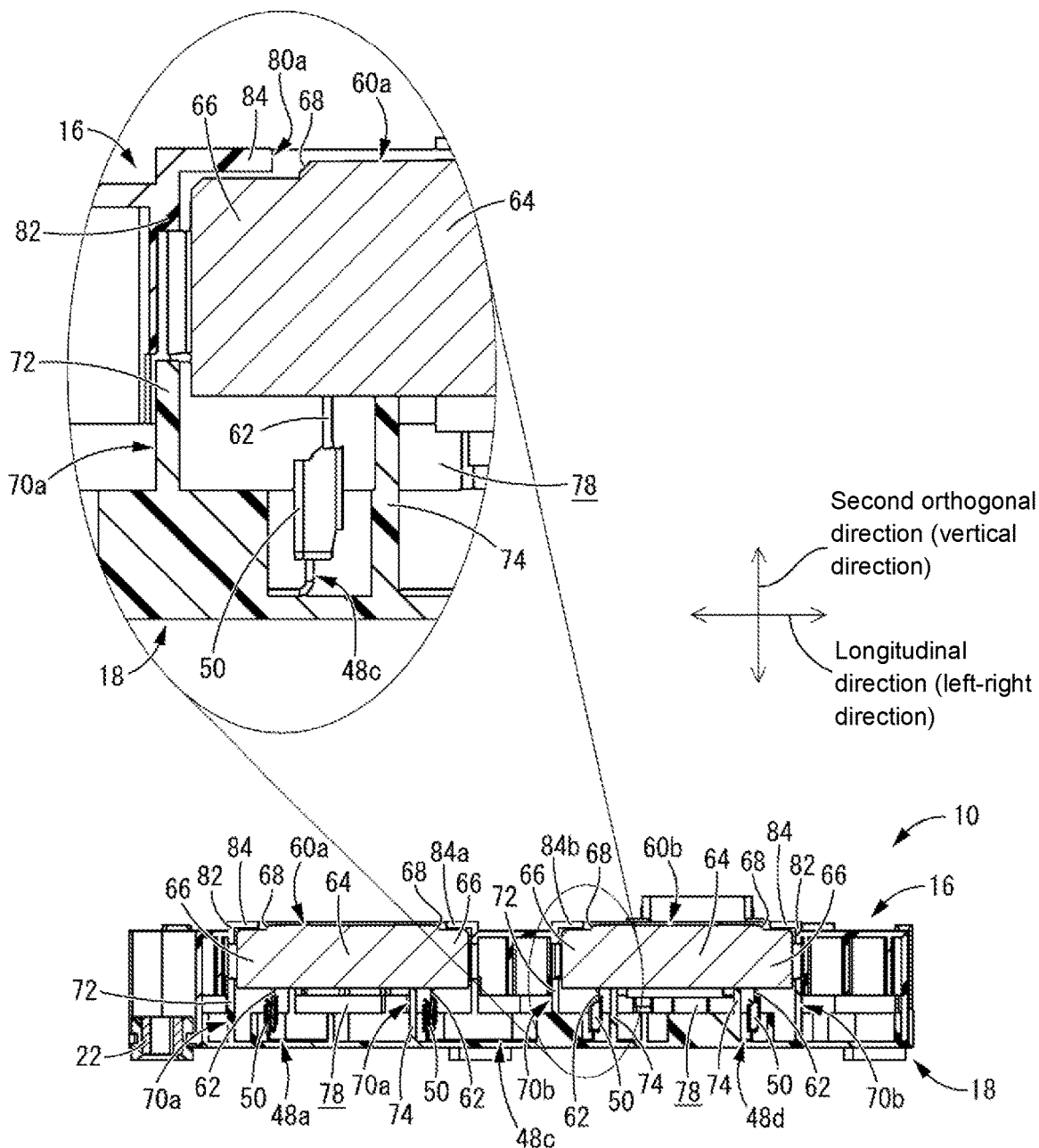
FIG. 3 is a cross-sectional view taken along line III-III of FIG. 2.
Figure 4:
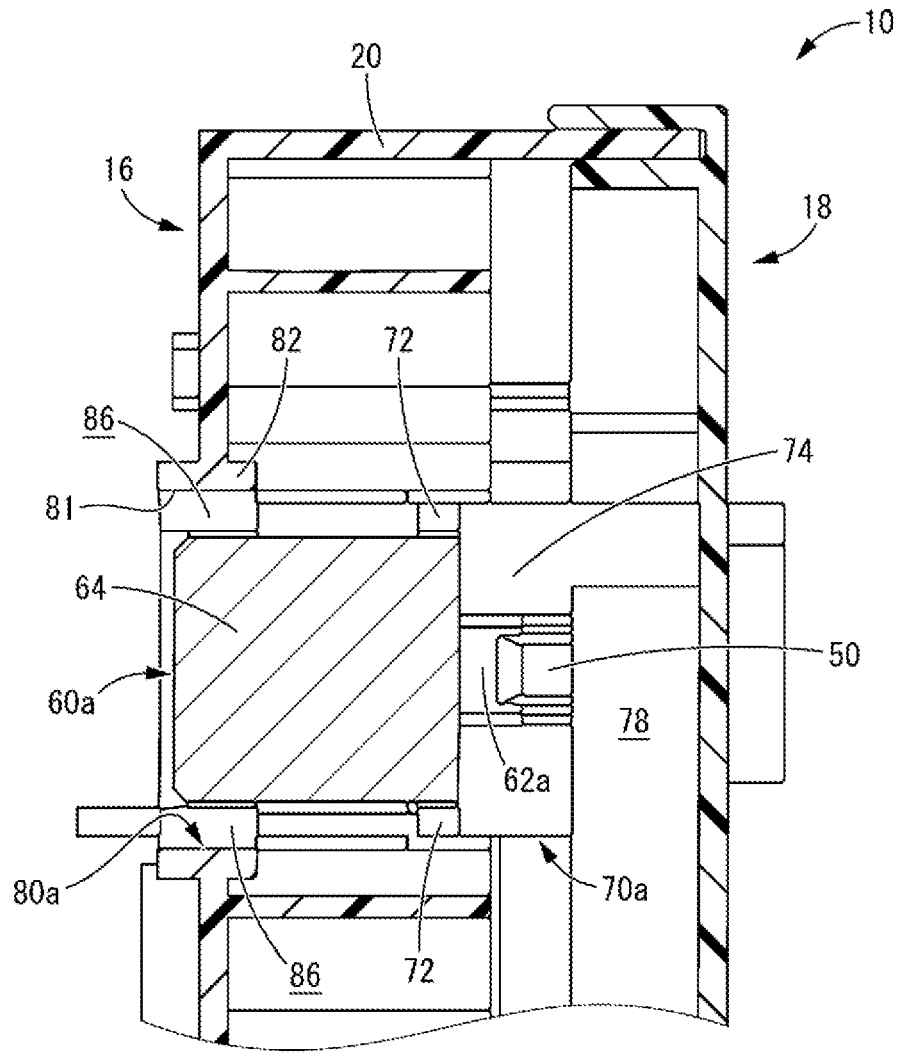
FIG. 4 is a cross-sectional view taken along line IV-IV of FIG. 2.

As shown in FIGS. 1, 3, and 4, the upper case 16 is set on the lower case from above, lidding the top surface of the lower case 18 with the upper case 16. In this way, the lower case 18 and the upper case 16 are fitted together in the vertical direction, forming the case 12 having a hollow box-shape structure.

Wiring Member 14

The wiring member 14 is housed in the case 12. The wiring member 14 is formed with a plurality of busbars 48a-48f. As shown in FIG. 1, the busbars 48a-48f are formed in various shapes. In the present embodiment, a total of six busbars 48a-48f are used, and the wiring member 14 is formed with these busbars 48a-48f. The busbars 48a-48f are all fabricated by press-cutting and bending flat sheets of metal into predetermined shapes.

A coupling terminal 50 for supplying current is integrally formed at one end of each busbar 48a-48f. The coupling terminals 50 of the present embodiment are bag-shaped female terminals into which the plate-shaped male terminals are inserted for connection. Each of the busbars 48a, 48b, 48e, and 48f is provided with a coupling terminal 50 at one end thereof. The other end of each of the busbars 48a, 48b has formed thereon an annular terminal 52 in the shape of a circular plate. The other end of each of the busbars 48e, 48f have formed thereon a plate-shaped connector coupling terminal 51 for coupling with a connector. Both busbars 48c, 48d have coupling terminals 50 at both ends.

Figure 5:
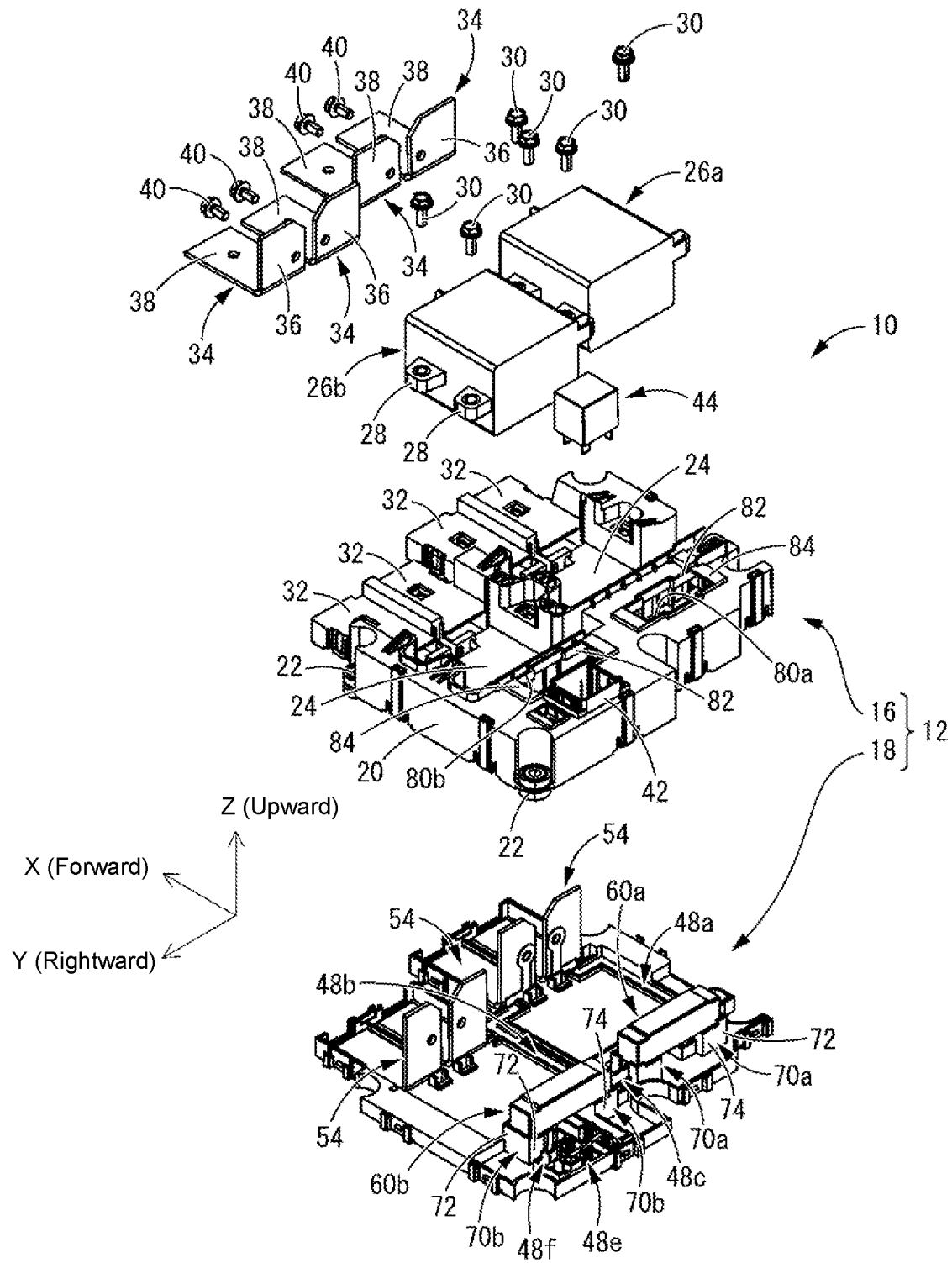
FIG. 5 is a perspective exploded view of the circuit unit shown in FIG. 1, showing a wiring member and resistors attached to a lower case.

As shown in FIGS. 1 and 5, the busbars 48a-48f are mounted in the busbar mounts 46 provided on the top surface of the lower case 18. That is, the busbars 48a-48f are positioned with respect to the lower case 18 by setting in position, tabular intermediate portions of the busbars 48a-48f that extend horizontally (orthogonal to the vertical direction) in the busbar mount portions 46. In this way, the wiring member 14, formed with the busbars 48a-48f, are held in the lower case 18.

The annular terminals 52 of the busbars 48a, 48b are set on the lower terminal brackets 54. The lower terminal brackets 54 are made of a conductive metallic material, and formed into L-shaped metallic parts each having a flat-plate fixing portion 56 and a contact portion 58. The annular terminals 52 of the busbars 48a, 48b are set on and in contact with the fixing portions 56 of the lower terminal brackets 54 from behind to conductively connect the busbars 48a, 48b with the lower terminal brackets 54.

The fixing portions 56 of the lower terminal brackets 54 penetrate the upper case 16 and are set on the fixing portions 36 of the upper terminal brackets 34. As a result, the lower terminal brackets 54 are conductively connected with the upper terminal brackets 34 and the power relays 26a, 26b. Note that the lower terminal brackets 54 that are conductively connected with the busbars 48a, 48b are connected with one of the power relays, or the power relay 26a, and the lower terminal brackets 54 that are spaced apart and separate from the busbars 48a-48f are conductively connected with the other power relay 26b. The contact portions 58 of the lower terminal brackets 54 are set on the bottom surfaces of the terminal supports 32 of the upper case 16.

The terminal portions of the pre-charge relay 44, which is set in the pre-charge relay mount portion 42 of the upper case 16, are connected with the coupling terminals 50 of the respective busbars 48b, 48d, 48e, 48f. This makes it possible to conductively connect the busbars 48b, 48f via the pre-charge relay 44. Note that the connector coupling terminals 51 of the busbars 48e, 48f are coupled with unshown wiring connectors.

Resistors 60a, 60b

As shown in FIGS. 1-5, resistors 60a, 60b serving as pre-charge resistors that constitute a pre-charge circuit are mounted on the lower case 18. While the internal structures are omitted from the view, the resistors 60a, 60b have a structure in which a resistive element providing an electrical resistance and an insulating substrate supporting the resistive element are housed in a protective portion, and a pair of terminal portions 62 conductively connected to both ends of the resistive element protrude downward. For example, a wire-wound resistive element with a resistive wire of an alloy, such as nickel-chromium (nichrome), copper-nickel, copper-manganese-nickel, etc., wound around a bobbin can be employed as the resistive element. In the present embodiment, the protective portion is made of ceramic although it may also be made of a metal. The resistors 60a, 60b have an approximately rectangular outer shape, and their length in the left-right direction (the left-right direction in FIG. 2) is formed greater than their length (width) in the front-rear direction (the vertical direction in FIG. 2). Thus, the left-right direction is referred to as the longitudinal direction of the resistors 60a, 60b, and the front-rear direction is referred to as the first orthogonal direction of the resistors 60a, 60b, which is the horizontal direction orthogonal to the longitudinal direction. Although the circuit unit 10 includes two resistors 60a, 60b, these resistors 60a, 60b may be identical to each other, or different from each other with regard to the value of resistance, structure, material, etc.

The resistors 60a, 60b have an intermediate portion 64 with a resistive element, not shown, located between a pair of terminal portions 62 in the longitudinal direction, and two end portions 66 shifted outwardly from the resistive element in the longitudinal direction. As shown in FIG. 3, the top surfaces of the end portions 66 of the resistors 60a, 60b are located below the top surfaces of the intermediate portions 64 of the resistors 60a, 60b, and steps 68 are formed in the top surfaces of the resistors 60a, 60b at the boundaries between the intermediate portions 64 and the end portions 66.

As a high voltage is applied to the resistors 60a, 60b, which constitute a pre-charge circuit, for a short period of time during energization, the intermediate portions 64, which include a resistive element with a wire-wound structure, generate large amounts of heat and develop high temperatures. As the two end portions 66 are located outward from the pair of terminal portions 62, which are connected to both ends of the resistive element, and are shifted from the resistive body, they do not reach as high temperatures as the intermediate portion 64 during energization. Moreover, as the resistors 60a, 60b are ceramic resistors with a ceramic protector, the resistors 60a, 60b have a lower rate of conductivity of heat from the intermediate portions 64 to the end portions 66 than metallic resistors with a metallic protector.

Attachment of Resistors 60a, 60b

As shown in FIG. 5, the resistor 60a is set on resistor supports 70a, which protrude from the top surface of the lower case 18. The resistor supports 70a are formed in the shape of an approximately rectangular tube and, as shown in FIGS. 1, 3, and 5, are provided on the two longitudinal ends of the resistor 60a. The resistor supports 70a have positioning ribs 72 that constitute longitudinal outer portions thereof and protrude considerably upward above lower supports 74 that constitute inner portions thereof.

The positioning ribs 72 have an L-shape cross-section and are arranged as a pair on two opposing ends of the bottom surface of the resistor 60a. The resistor supports 70a of the present embodiment have a generally U-shaped cross section, with the two positioning ribs 72 arranged continuously or in close proximity. The ribs 72 of the resistor supports 70a are set on the outer surfaces in the longitudinal direction and the first orthogonal direction of the lower part of the resistor 60a, and the lower corners 76 provided at the end portions 66 of the resistor 60a are inserted. The resistor 60a is positioned horizontally with respect to the lower case 18 by inserting a pair of corners 76 located diagonally on the bottom surface of the resistor 60a into the positioning ribs 72. In the present embodiment, two pairs of positioning ribs 72 are provided that correspond to the four lower corners 76 of the resistor 60a, and all of the four corners 76 of the resistor 60a are inserted in the positioning ribs 72. In this way, the positioning of the resistor 60*a* with respect to the lower case 18 is implemented more effectively.

The lower supports 74 of the resistor supports 70*a* are set on the bottom surface of the resistor 60*a*, and as the resistor 60*a* is supported by the lower supports 74 of the resistor supports 70*a*, the resistor 60*a* is positioned with respect to the lower case 18 in the vertical direction.

The terminal portions 62 of the resistor 60*a* set on the lower case 18 are, as shown in FIG. 3, brought into contact with the coupling terminals 50 of the busbars 48*a*, 48*c* arranged in the inner perimeters of the resistor supports 70*a*.

As shown in FIG. 5, the resistor 60*b* is set on the resistor supports 70*b*, which protrude from the top surface of the lower case 18. As the resistor supports 70*b* are substantially the same as the resistor supports 70*a*, a detailed description thereof is omitted. The resistor 60*b* is positioned with respect to the lower case 18 in the orthogonal direction by inserting the lower corners 76 of the end portions 66 in the positioning ribs 72 of the resistor supports 70*b*. Furthermore, the resistor 60*b* is positioned with respect to the lower case 18 in the vertical direction by setting the lower supports 74 of the resistor supports 70*b* on the bottom surface of the resistor 60*b*.

The terminal portions 62 of the resistor 60*b* set on the lower case 18 are, as shown in FIG. 3, brought into contact with the coupling terminals 50 of the busbars 48*c*, 48*d* arranged in the inner perimeters of the resistor supports 70*b*. As a result, the power relays 26*a*, the resistors 60*a*, 60*b*, and the pre-charge relay 44 are serially connected via the busbars 48*a*-48*d*.

Lower Cavities 78

The intermediate portions 64 of the resistors 60*a*, 60*b* are separated from the lower case 18 in the second orthogonal direction (the vertical direction), which is orthogonal to the longitudinal and first orthogonal directions, without contacting any portion other than the lower supports 74 of the resistor supports 70*a*, 70*b*. As a result, in the second orthogonal direction, the separation distance between the intermediate portions 64 of the resistors 60*a*, 60*b* and the lower case 18 is, at least in part, greater than the separation distance between the end portions 66 of the resistors 60*a*, 60*b* and the lower case 18 (the lower supports 74). More specifically, the resistor 60*a* or the resistor 60*b* is separated from the lower case 18 between the longitudinally separated resistor supports 70*a* or 70*b*, which come into contact with the resistor 60*a* or the resistor 60*b*. As a result, lower cavities 78 are formed between the parts of the intermediate portions 64 of the resistors 60*a*, 60*b* that are not in contact with the resistor supports 70*a*, 70*b*, and the lower case 18. This impedes the conduction of the heat from the intermediate portion 64*s* of the resistors 60*a*, 60*b*, which generate high temperatures during energization, to the lower case 18.

The resistors 60*a*, 60*b* are located above the lower case 18, except where the corners 76 of the end portions 66 are inserted into the positioning ribs 72 of the lower case 18. Therefore, the intermediate portions 64 of the resistors 60*a*, 60*b* are not covered by the lower case 18 in the first orthogonal direction (the front-rear direction).

Window Portions 80*a*, 80*b*

The resistors 60*a*, 60*b* are exposed through window portions 80*a*, 80*b* that penetrate the upper case 16. The window portions 80*a*, 80*b* have a rectangular cross-section in the left-right direction as the longitudinal direction. With the upper case 16 fitted on the lower case 18 from above, the top surfaces of the intermediate portions 64 in the longitudinal direction of the resistors 60*a*, 60*b* are exposed to the outside through the window portions 80*a*, 80*b*. The window portions 80*a*, 80*b* include a widened portion 81 or a longitudinal intermediate portion that is wider than the two ends in the first orthogonal direction.

Wall Portions 82

Tubular wall portions 82 are provided on the open peripheries of the window portions 80*a*, 80*b* of the upper case 16 as shown in FIGS. 3 and 4. The tubular wall portions 82 protrude both upward and downward from the open peripheries of the window portions 80*a*, 80*b*, and the portions that protrude downward are disposed to surround the peripheries of the top ends of the resistors 60*a*, 60*b*.

Presser Portions 84

Presser portions 84 that protrude from the top ends of the wall portion 82 toward the window portions 80*a*, 80*b* are provided on the longitudinal ends of the window portions 80*a*, 80*b*. Furthermore, as the presser portions 84 are in abutment against the top surfaces of the longitudinal end portions 66 of the resistors 60*a*, 60*b*, the presser portions 84 prevent the resistors 60*a*, 60*b* from being disengaged from the case 12 upwardly through the window portions 80*a*, 80*b*. The resistor 60*a*, 60*b* are supported by the case 12 with the end portions 66 of the resistor 60*a*, 60*b* held between the lower supports 74 of the resistor supports 70*a*, 70*b* and the presser portions 84.

Lateral Cavities 86

The window portions 80*a*, 80*b* of the upper case 16 include a widened portion 81 in an intermediate section in the longitudinal direction. In the first orthogonal direction, the separation distance between the intermediate portions 64 of the resistors 60*a*, 60*b* and the wall portions 82 of the upper case 16 is greater than the separation distance between the end portions 66 of the resistors 60*a*, 60*b* and the wall portions 82. As a result, lateral cavities 86 are formed between the intermediate portions 64 of the resistors 60*a*, 60*b* and the wall portions 82 in the first orthogonal direction.

In this way, the intermediate portions 64 of the resistors 60*a*, 60*b* are further spaced apart from the upper case 16 in the first orthogonal direction than are the end portions 66. Therefore, the heat conduction is impeded from the intermediate portions 64 of the resistors 60*a*, 60*b*, which develop high temperatures, to the upper case 16 as the conduction occurs via the lateral cavities 86, thus reducing the adverse effect of the heat generated by the resistors 60*a*, 60*b* on the upper case 16. Furthermore, as the lateral cavities 86 are open to the outside at the top surface of the upper case 16, heat is less likely to be trapped in the lateral cavities 86, improving heat dissipation.

Additionally, the window portions 80*a*, 80*b* are provided in the upper case 16 to expose the top surfaces of the intermediate portions 64 of the resistors 60*a*, 60*b* to the outside through the window portions 80*a*, 80*b*. As such, the heat of the intermediate portions 64 of the resistors 60*a*, 60*b* can be prevented from reaching from the top surfaces of the intermediate portions 64 and affecting the upper case 16, and heat dissipation of the resistors 60*a*, 60*b* is also more easily ensured.

In this way, in the circuit unit 10, heat conduction is suppressed from the resistors 60*a*, 60*b* to the upper case 16. Any adverse effect of the heat from the resistors 60*a*, 60*b* on the upper case 16 can be prevented without forming the upper case 16 from a heat-resistant material or upsizing the resistors 60*a*, 60*b* to increase their thermal capacity. Accordingly, the circuit unit 10 can be made smaller, allowing for weight reduction.

The resistors 60*a*, 60*b* are supported on the end portions 66, where the heat generation is relatively small compared to the intermediate portions 64, between the presser portions 84 of the upper case 16 and the lower supports 74 of the lower case 18. In this way, the resistors 60a, 60b can be positioned with respect to the case 12 at the end portions 66, where the temperature rise is relatively small, while avoiding the adverse effects of the transfer of heat to the case 12 from the intermediate portions 64, where high temperatures develop, of the resistors 60a, 60b.

The resistors 60a, 60b are positioned in the horizontal direction with respect to the case 12 by inserting the lower corners 76 of the resistors 60a, 60b into the positioning ribs 72 of the lower case 18. Steps 68 are provided on the top surfaces of the resistors 60a, 60b, and the resistors 60a, 60b and the case 12 can also be positioned in the longitudinal direction by the abutment of the presser portions 84 of the case 12 against the steps 68.

Since the resistors 60a, 60b are ceramic resistors with a protective body made of ceramic, the heat generated in the intermediate portions 64 when current flows through the resistors 60a, 60b is not easily transferred to the end portions 66. Therefore, even with the resistors 60a, 60b attached to the case 12 at the end portions 66, the heat generated from the resistors 60a, 60b to the case 12 can be suppressed by providing the lateral cavities 86 and the lower cavities 78 between the intermediate portions 64 and the case 12.

Other Embodiments

The technical aspects described herein are not limited to the embodiment described in connection with the foregoing description and attached drawings; rather, the following embodiments, for example, also fall under the scope of the technology described herein.

(1) The above-described embodiment shows an example in which the wall portions 82 of the upper case 16, which surround the horizontal peripheries of the resistors 60a, 60b, are more spaced apart from the intermediate portions 64 of the resistors 60a, 60b than from the end portions 66 of the resistors 60a, 60b in the front-rear direction. However, if the upper case 16 is provided to cover the top sides of the resistors 60a, 60b, the wall portions of the upper case 16 may be portions that cover the upper side of the resistors 60a, 60b. In this case, the first orthogonal direction will be the vertical direction, so that the portions of the upper case 16 that cover the top sides of the resistors 60a, 60b are more distanced from the intermediate portions 64 of the resistors 60a, 60b than from the end portions 66 of the resistors 60a, 60b in the vertical direction. Note that, in the above-described aspect, where the first orthogonal direction is the vertical direction, both the first orthogonal direction and the second orthogonal direction can both be the vertical direction. In this way, the first orthogonal direction and the second orthogonal direction can be different directions from each other or the same direction.

Moreover, there may be a plurality of first orthogonal directions that intersect the longitudinal direction at right angles. That is, if the distances between the intermediate portions 64 and the upper case 16 in the front-rear direction and the vertical direction are greater than the end portions 66 and the upper case 16 in the front-rear direction and the vertical direction, then the first orthogonal direction is both the front-rear direction and the vertical direction.

The second orthogonal direction in the lower case 18 is not limited to the vertical direction indicated in the above-described embodiment as in the case of the first orthogonal direction. That is, if the lower case 18 is disposed on the outside in the front-rear direction of the resistors 60a, 60b, the second orthogonal direction may be the front-rear direction. In this case, the first orthogonal direction and the second orthogonal direction may be both the front-rear direction, or, for example, the first orthogonal direction may be the vertical direction and the second orthogonal direction may be the front-rear direction. Moreover, as in the case of the first orthogonal direction, there may be a plurality of second orthogonal directions that intersect the longitudinal direction at right angles.

If the left-right direction is the longitudinal direction, the first orthogonal direction and the second orthogonal direction is limited to either the front-rear direction or the vertical direction; rather, they may be a direction orthogonal to the longitudinal direction and tilted with respect to the front-rear direction and the vertical direction.

(2) The wall portions 82 of the upper case 16 that surround the peripheries of the resistors 60a, 60b are not necessarily limited to a tubular shape extending in the vertical direction. Specifically, for example, even if the tubular wall portions 82 are not provided in the above-described embodiment, the open peripheries of the window portions 80a, 80b of the upper case 16 may be considered wall portions.

(3) The sections of the wall portions 82 that are widened in the first orthogonal direction to form the lateral cavities 86 (the widened portions 81) may have the width dimension changed with respect to portions other than the widened portion 81 in a stepwise manner in the first orthogonal direction as in the above-described embodiment; alternatively, the width dimension may be gradually changed.

(4) Although the entire intermediate portions 64 of the resistors 60a, 60b are preferably separated from the upper case 16 in the first orthogonal direction, it will suffice if they are at least partially separated from the upper case 16, and they may also be partially closer to the upper case 16 than the end portions 66. Likewise, although the entire intermediate portions 64 of the resistors 60a, 60b are preferably separated from the lower case 18 in the second orthogonal direction, it will suffice if they are at least partially separated from the lower case 18, and they may also be partially closer to the lower case 18 than the end portions 66.

(5) In the above-described embodiment, the resistors 60a, 60b are attached to the case 18 by being held between the presser portions 84 provided in the window portions 80a, 80b of the upper case 16 and the resistors supports 70a, 70b of the lower case 18, respectively. There is no particular limitation to the structure for attaching the resistors 60a, 60b to the case 12. Specifically, for example, claw-like members to be set on the top surfaces of the end portions 66 of the resistors 60a, 60b may be provided in the portions of the lower case 18 where the resistors 60a, 60b are attached. In this way, the resistors 60a, 60b are attached to the case 12 by being interposed between the top surface of the lower case 18 and the claw-like members.

(6) While the configuration of serially connected resistors 60a, 60b has been described in the above-described embodiment, there may be provided one or at least three resistors. Furthermore, the electrical circuit constituting the circuit unit may be modified as appropriate as long as it includes resistors; for example, other devices such as fuses, connectors, and the like may be included, and, in various types of circuit units, the same advantageous effects can be obtained as in the above-described embodiment.

(7) Although the intermediate portions 64 of the resistors 60a, 60b are disposed between the terminal portions 62 in the above-described embodiment, if the terminal portions 62 protrude from locations closer to the longitudinal center of the resistive element than to both ends of the resistive element, the intermediate portions 64 may also include portions outside of the terminal portions 62. In brief, the intermediate portion 64 refers to the portion that develops high temperatures due to the heat generated by the resistive element during energization, but is not necessarily limited to the portion between the terminal portions 62.

LIST OF REFERENCE NUMERALS

- 10 Circuit unit
- 12 Case
- 14 Wiring member
- 16 Upper case
- 18 Lower case
- 20 Peripheral wall
- 22 Attaching member
- 24 Power relay mount portion
- 26a, 26b Power relay
- 28 Bolt insertion lug
- 30 Bolt
- 32 Terminal support
- 34 Upper terminal bracket
- 36 Fixing portion
- 38 Contact portion
- 40 Bolt
- 42 Pre-charge relay mount portion
- 44 Pre-charge relay
- 46 Busbar mount portion
- 48a-48f Busbar
- 50 Coupling terminal
- 51 Connector coupling terminal
- 52 Annular terminal
- 54 Lower terminal bracket
- 56 Fixing portion
- 58 Contact portion
- 60a, 60b Resistor
- 62 Terminal portion
- 64 Intermediate portion
- 66 End portion
- 68 Step
- 70a, 70b Resistor support
- 72 Positioning rib
- 74 Lower support
- 76 Corner
- 78 Lower cavity
- 80a, 80b Window portion
- 81 Widened portion
- 82 Wall portion
- 84 Presser portion
- 86 Lateral cavity

The invention claimed is:

1. A circuit unit comprising:
a wiring member,
a lower case that holds the wiring member,
an upper case that covers the lower case, and
a resistor connected to the wiring member,
wherein the upper case includes a wall portion that surrounds a circumference of the resistor,
wherein, in a first orthogonal direction orthogonal to a longitudinal direction of the resistor, a separation distance between an intermediate portion in the longitudinal direction of the resistor and the wall portion of the upper case is greater than a separation distance between end portions in the longitudinal direction of the resistor and the wall portion of the upper case, and
wherein, in a second orthogonal direction orthogonal to the longitudinal direction of the resistor, a separation distance between the intermediate portion of the resistor and the lower case is greater than a separation distance between the end portions of the resistor and the lower case.

2. The circuit unit of claim 1, wherein the upper case includes presser portions that are in contact with a top surface of the resistor.

3. The circuit unit of claim 1, wherein the lower case includes positioning ribs into which the end portions of the resistor are inserted.

4. The circuit unit of claim 1, wherein the intermediate portion of the resistor is a portion located between a pair of terminal portions in the longitudinal direction of the resistor that protrudes from a bottom surface of the resistor.

* * * * *